United States Patent
Brown (10) Patent No.: US 11,143,723 B2
(45) Date of Patent: Oct. 12, 2021

(54) FLEXIBLE LOCAL COIL FOR MAGNETIC RESONANCE IMAGING

(71) Applicant: Neocoil, LLC, Pewaukee, WI (US)

(72) Inventor: Brian Brown, Wauwatosa, WI (US)

(73) Assignee: NEOCOIL, LLC, Pewaukee, WI (US)

(*) Notice: Subject to any disclaimer, the term of this patent is extended or adjusted under 35 U.S.C. 154(b) by 2 days.

(21) Appl. No.: 16/737,043

(22) Filed: Jan. 8, 2020

(65) Prior Publication Data

US 2021/0208220 A1   Jul. 8, 2021

(51) Int. Cl.
*G01R 33/34* (2006.01)
*G01R 33/48* (2006.01)

(52) U.S. Cl.
CPC .  *G01R 33/34084* (2013.01); *G01R 33/34007* (2013.01); *G01R 33/48* (2013.01)

(58) Field of Classification Search
CPC ........ G01R 33/34084; G01R 33/34007; G01R 33/48
See application file for complete search history.

(56) References Cited

U.S. PATENT DOCUMENTS

| | | | |
|---|---|---|---|
| 6,798,204 B2 | 9/2004 | Seeber et al. | |
| 7,663,367 B2 | 2/2010 | Wiggins | |
| 9,000,766 B2 | 4/2015 | Chu et al. | |
| 9,002,431 B2* | 4/2015 | Jones | G01R 33/34007 600/421 |
| 2005/0253582 A1* | 11/2005 | Giaquinto | G01R 33/3415 324/318 |
| 2019/0154773 A1 | 5/2019 | Stack et al. | |
| 2019/0154774 A1* | 5/2019 | Hushek | G01R 33/34007 |
| 2019/0154775 A1 | 5/2019 | Stack et al. | |
| 2019/0277926 A1 | 9/2019 | Stormont et al. | |
| 2019/0310327 A1 | 10/2019 | Stormont et al. | |
| 2020/0348380 A1* | 11/2020 | Taracila | G01R 33/3415 |
| 2020/0408860 A1* | 12/2020 | Taracila | A61B 5/055 |
| 2021/0018579 A1* | 1/2021 | Nixdorf | G01R 33/34084 |

FOREIGN PATENT DOCUMENTS

WO    2018/098255 A1    5/2018

* cited by examiner

*Primary Examiner* — G. M. A Hyder
(74) *Attorney, Agent, or Firm* — Boyle Fredrickson, SC (57) ABSTRACT

A flexible coil with improved tolerance for overlapping antennas and with reduced susceptibility to the introduction of image artifacts as a result of overlapping antennas utilizes antennas with multiple conductors extending in parallel for the length of the antenna. Each conductor is connected to the other conductor at each end creating parallel conduction paths for the length of the antenna. The parallel conduction paths reduce the resistance of the antenna which, in turn, improves the quality factor of the antenna. The improved quality factor results in antennas that are less susceptible to image artifacts being induced in the antenna due to coupling from an overlapping antenna.

10 Claims, 5 Drawing Sheets

FLEXIBLE LOCAL COIL FOR MAGNETIC RESONANCE IMAGING

BACKGROUND OF THE INVENTION

The subject matter disclosed herein relates to magnetic resonance imaging (MRI) and, more specifically, to a flexible local coil for use in an MRI scanner.

As is known to those skilled in the art, an MRI scanner generates a strong magnetic field which aligns nuclei in the presence of the magnetic field and then detects the faint nuclear magnetic resonance (NMR) signals given off as radio frequency signals by nuclei returning to a normal state in the absence of the magnetic field. The NMR signals are detected using antennas. The antennas are connected to a signal conditioning circuit such as a filter or an amplifier circuit, where each antenna and corresponding signal conditioning circuit are commonly referred to as a channel. The antenna and signal conditioning circuit are configured to detect and send the NMR signals to the host MRI scanner that enable trained practitioners to make appropriate diagnoses of an anatomical region of interest. For effective imaging, multiple channels may be provided to obtain the NMR signals over an entire region of interest. The antennas and the corresponding signal conditioning circuit for each antenna may be mounted within housings which take on different shapes due to the shape of the anatomical region of interest. The antennas, the signal conditioning circuits, and the housing are commonly referred to as a "coil" or a "local coil".

When multiple channels are arranged within a housing of a local coil, it is often desirable to overlap the antennas to detect NMR signals from the entire region to be imaged. However, when antenna loops overlap, cross-coupling occurs between overlapping antennas such that a signal detected by one antenna may generate an artifact on another antenna. Techniques have been developed to arrange the antennas within the housing and to process the signals with the signal conditioning circuit to minimize or eliminate the artifacts due to the cross-coupling. These techniques typically rely on consistent positioning of the antennas with respect to each other.

Once the antennas have been positioned with respect to each other, they must maintain the spatial relationship during use and, in particular, with respect to the overlapping relationship between antennas. Maintaining the spatial relationship of multiple antennas positioned within a housing has commonly been achieved by use of a rigid housing. The rigid housing allows the antennas to be precisely positioned within the housing, and during use, the rigid housing protects the antennas and retains the consistent spatial relationship between antennas.

As is also known to those skilled in the art, the distance an antenna is positioned from the anatomical region of interest directly impacts the signal to noise (SNR) ratio for the measured NMR signal. As the antenna is positioned closer to the anatomical region of interest, the magnitude of the measured signal increases thereby increasing the SNR. Therefore, it is desirable to position antennas close to the anatomical region to be imaged. In order to position the antennas close to the anatomical region to be imaged, the housing of a local coil may be shaped to conform to the anatomical region.

The housings may take on different shapes corresponding to the shape of the anatomical region of interest. The shape of a housing to fit, for example, over a shoulder is necessarily different than the shape of a housing used to image a foot. Similarly, the antenna arrays and housings need to adapt for variations in the size of a particular anatomical region. The same housing sized to fit a pediatric torso will not fit the torso of a large adult. As a result, the coils must be designed to accommodate a broad range of anatomical regions of varying sizes, and imaging centers are required to invest in a significant number of coils to cover all imaging applications. Therefore, it would be desirable to provide an imaging system that reduces the number of sizes and configurations of coils required while servicing the same or an increased breadth of imaging applications.

In order to reduce the number of coils an imaging center requires, developments have been made in manufacturing flexible antenna coils. However, the flexible antenna coil is similarly constructed to maintain the consistent positioning of individual antenna loops with respect to each other in order to avoid introducing unwanted artifacts in an image. Typically, a flexible antenna coil includes multiple antennas made from a flexible material mounted to a flexible, thin film substrate, such as KAPTON®. The antennas are securely mounted, for example, with an adhesive material or other bonding technique to maintain the desired positioning of each antenna loop with respect to the other antennas on the flexible substrate. The signal conditioning circuits for each antenna are similarly mounted to or positioned on the flexible substrate. The antennas and flexible substrate are then covered in an interior layer of foam surrounding the antennas and their corresponding signal conditioning circuits and an exterior layer made, for example, of a plastic, nylon, rubber, or combination thereof. The foam is included for patient comfort and the external layer is included as a protective layer for the foam and the antennas on the interior to withstand regular contact with the patient, the imaging table, and the like.

In addition to securely mounting the antennas to a flexible substrate, the flexible substrates are typically restricted to folding around only a single axis. Flexible structural members may be included that permit bending in a first direction while resisting bending in a direction orthogonal to the first direction. Limiting the flexible substrate to bend in only one direction (e.g., cylindrical) further helps to maintain the desired relationship between antennas within the coil. Folding around a single axis permits, for example, a single coil to be wrapped around arms or legs of varying sizes without requiring multiple coils for different patient sizes. However, restricting the flexible substrate to folding along a single axis prevents maximum contact along more complex patient geometries, such as a shoulder.

As flexible coils continue to improve, the materials from which they are made allow for more flexibility and a better ability to conform to the anatomy of a patient. This flexibility, however, may also allow for a fold in the material or overlapping of the material of the coil, which, in turn, causes overlapping of the antennas within the coil. The antennas may overlap in unexpected spatial relationships causing undesirable image artifacts.

Thus, it would be desirable to provide a flexible coil with improved tolerance for overlapping antennas and reduced susceptibility to the introduction of image artifacts as a result of overlapping antennas.

BRIEF DESCRIPTION OF THE INVENTION

A flexible coil with improved tolerance for overlapping antennas and with reduced susceptibility to the introduction of image artifacts as a result of overlapping antennas is disclosed herein. The flexible coil utilizes antennas with multiple conductors extending in parallel for the length of the antenna. Each conductor is connected to the other conductor at each end creating parallel conduction paths for the length of the antenna. The parallel conduction paths reduce the resistance of the antenna which, in turn, improves the quality factor, Q, of the antenna. The improved quality factor results in antennas having a greater SNR.

According to one embodiment of the invention, a flexible local coil for use with a Magnetic Resonance Imaging (MRI) scanner includes a flexible substrate configured to bend in multiple non-parallel axes and multiple antennas mounted to the flexible substrate. Each of the antennas overlaps at least one other antenna, and each of the antennas includes multiple electrical conductors, where each of the electrical conductors includes a first end and a second end. Each of the electrical conductors for one of the antennas are mounted together on the flexible substrate such that they bend along each of the non-parallel axes in tandem. Each of the electrical conductors for one of the antennas is electrically connected at both the first end and the second end and an insulating layer is present between electrical conductors such that a parallel electrical connection is established along a length of the antenna.

According to another aspect of the invention, each of the electrical conductors in one of the antennas is arranged adjacent to each other. Optionally, each of the electrical conductors in one of the antennas is arranged in a coaxial configuration.

According to yet another aspect of the invention, the flexible local coil includes multiple signal conditioning circuits. Each antenna includes a first end and a second end and is connected to one of the signal conditioning circuits at both the first end and the second end. Each of the antennas may form a continuous conductive path between the first end and the second end.

According to still another aspect of the invention, the flexible local coil may also include at least one distribution capacitor, and each of the antennas may include at least two antenna segments. Each antenna segment is connected at a first end and at a second end to either the corresponding signal conditioning circuits or to one of the distribution capacitors.

According to another embodiment of the invention, a flexible local coil for use with a MRI scanner includes a flexible substrate configured to bend in multiple non-parallel axes and multiple channels mounted to the flexible substrate. Each channel overlaps at least one other channel, and each channel is mounted such that it bends along each of the non-parallel axes. Each channel includes multiple electrical conductors, where each electrical conductor includes a first end and a second end. Each of the electrical conductors for one of the channels is electrically connected at both the first end and the second end, and an insulating layer is present between electrical conductors such that a parallel electrical connection is established along the plurality of electrical conductors from the first end to the second end.

These and other advantages and features of the invention will become apparent to those skilled in the art from the detailed description and the accompanying drawings. It should be understood, however, that the detailed description and accompanying drawings, while indicating preferred embodiments of the present invention, are given by way of illustration and not of limitation. Many changes and modifications may be made within the scope of the present invention without departing from the spirit thereof, and the invention includes all such modifications.

BRIEF DESCRIPTION OF THE DRAWINGS

Various exemplary embodiments of the subject matter disclosed herein are illustrated in the accompanying drawings in which like reference numerals represent like parts throughout, and in which.

In describing the various embodiments of the invention which are illustrated in the drawings, specific terminology will be resorted to for the sake of clarity. However, it is not intended that the invention be limited to the specific terms so selected and it is understood that each specific term includes all technical equivalents which operate in a similar manner to accomplish a similar purpose. For example, the word "connected," "attached," or terms similar thereto are often used. They are not limited to direct connection but include connection through other elements where such connection is recognized as being equivalent by those skilled in the art.

DETAILED DESCRIPTION OF THE INVENTION

The various features and advantageous details of the subject matter disclosed herein are explained more fully with reference to the non-limiting embodiments described in detail in the following description.

Figure 1:
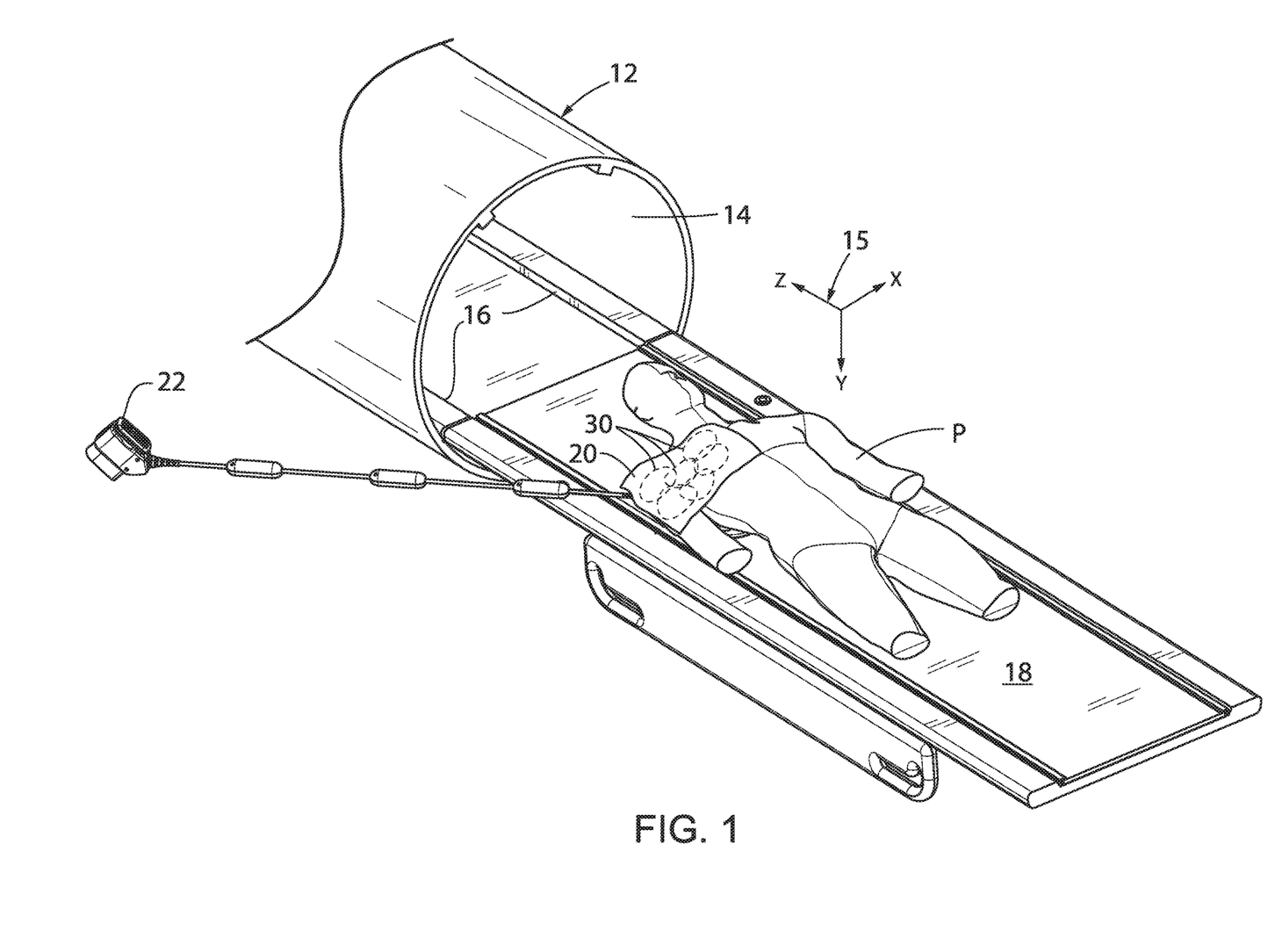
FIG. 1 is a partial perspective view of an MRI scanner with a patient positioned on a table for the scanner and a flexible local coil according to one embodiment of the invention positioned on the patient.

Turning initially to FIG. 1, portions of an exemplary MRI scanner 12 are illustrated. The MRI scanner 12 includes a bore 14 in which a patient, P, is positioned during imaging.

Prior to imaging, the patient, P, is initially positioned on a scan table 18 external to the bore 14. Once a patient, P, is positioned on the table 18 external from the bore, the table may be slid into the bore along rails 16 extending along each side of the table. A coordinate system 15 may be defined within the MRI scanner in which an origin of the coordinate system is present at the upper left position at the entrance of the bore 14. An X-axis extends in a positive direction from the right-to-left of the patient, P, positioned on the table 18. A Y-axis extends in a positive direction from the front-to-rear (anterior-to-posterior) of the patient, P, and a Z-axis extends in a positive direction from the feet-to-head (inferior-to-superior) of the patient. One or more MRI coils 20 may be positioned on or around the patient, P, to obtain images in one or more of these planes during a scan.

According to the illustrated embodiment, one exemplary local coil 20 with an array of six antennas 30 is used to detect the NMR signals from an anatomical region of interest on the patient, P. A flexible local coil 20 is draped over the shoulder of the patient, P, such that the local coil bends in at least two axes and, commonly, bend in each of the three axes, conforming to the contours of the patient beneath the local coil 20. The local coil 20 includes a plug 22 which is connected to the scanner 12 and transmits the NMR signals detected by each of the antennas 30 to the scanner. The local coil 20 is presented as an exemplary coil for purposes of discussion herein. Various other coils and/or multiple coils may be utilized during a scan, where each coil may take various shapes or sizes and may have varying numbers of antennas within each coil may be utilized according to the anatomical region of interest and scan protocol utilized during a scan.

Figure 2:
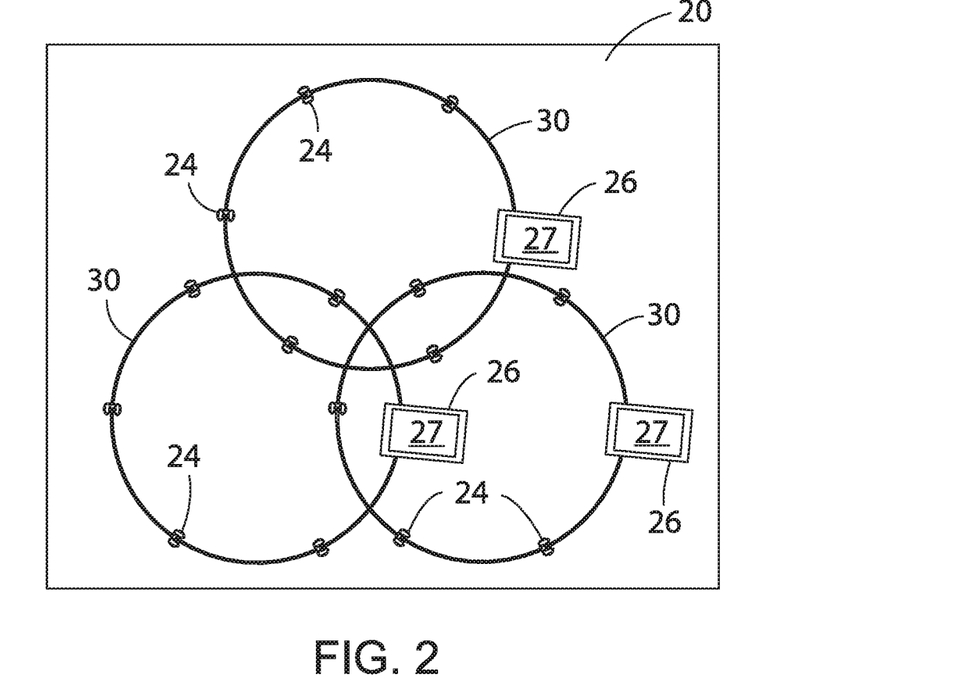
FIG. 2 is a top plan view of a flexible local coil according to another embodiment of the invention in which the antennas on the flexible local coil are continuous along the length of each loop.
Figure 3:
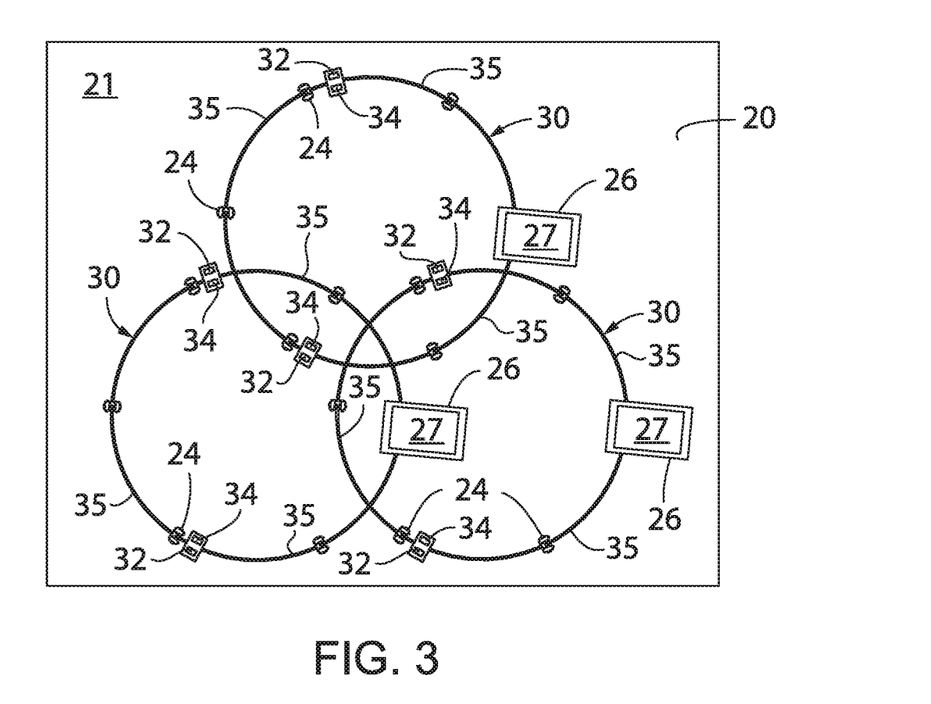
FIG. 3 is a top plan view of a flexible local coil according to another embodiment of the invention in which the antennas on the flexible local coil include distributed capacitance at intervals along each loop.

Turning next to FIGS. 2 and 3, two flexible coils 20 are illustrated laying on a flat surface with each coil having three antennas 30. Each antenna 30 is mounted to a flexible substrate 21. The flexible substrate 21 is made of a material that is invisible to the medical imaging system. In a magnetic resonance imaging (MRI) scanner, therefore, the flexible substrate is made of a material that is not excited by the presence of the magnetic field generated by the MRI scanner 12. As a result, the flexible substrate 21 does not generate an image artifact and is not observable when an object is being imaged by the MRI scanner 12. Further, the flexible substrate 21 and objects connected to the flexible substrate are made from materials that are not susceptible to magnetic fields and, therefore, are not affected by the magnetic field gradients generated by the MRI scanner.

According to one embodiment of the invention, the flexible substrate 21 is made from a fibrous material. The fibrous material may be a natural or a synthetic fiber. The flexible substrate 21 is preferably a dimensionally stable fabric material, resisting stretching or shrinking; abrasion resistant to avoid damage by electronic components and/or circuit boards mounted to the substrate; and heat resistant, to avoid damage should localized heating occur during medical imaging. In one embodiment, the flexible substrate 21 is a para-aramid synthetic fiber. Preferably, the synthetic fiber exhibits little elasticity in the plane of the fabric such that its original form factor is retained during use in medical imaging. However, the fibrous material allows the flexible substrate 21 to be positioned on an object to be imaged, for example, by draping the flexible substrate 21 on the object and the flexible substrate bends in at least two axes and conforms to the shape of the object. In other words, the synthetic fiber resists stretching but allows rolling, folding, or other such forces to position the flexible substrate 21. Optionally, the flexible substrate 21 may be made from a woven material.

As also illustrated in FIGS. 2 and 3, fasteners 24 are provided to secure the antennas 30 to the flexible substrate 21. In one embodiment of the invention, holes may be made through the flexible substrate 21. The holes may be cut, for example, by drilling, stamping, die cutting, laser cutting, or the like in the flexible substrate 10. The fastener 24 may be a single piece or multi-piece fastener that extends through the holes and secures the antennas 30 to the flexible substrate. The fasteners 24 allow each antenna to bend with the flexible substrate while maintaining, at least in part, a relationship between antennas 30 mounted to the flexible substrate.

Figure 10:
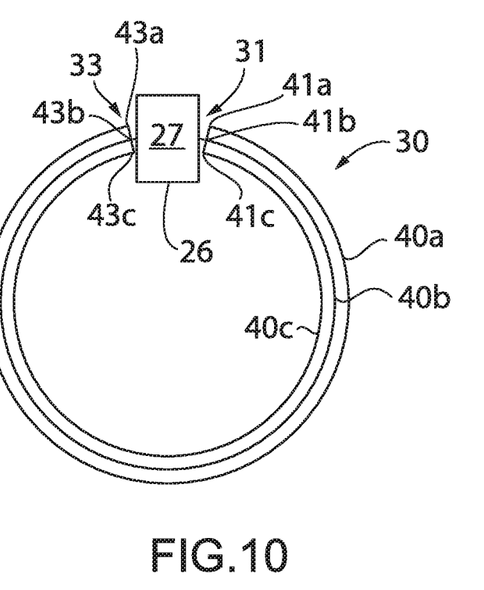
FIG. 10 is a schematic representation of the conductors in one antenna of FIG. 2.

With reference again to FIG. 2, each antenna 30 includes a signal conditioning circuit 27 mounted on a feed board 26 to which the antenna 30 is electrically connected. The signal conditioning circuit 27 includes, for example, one or more reactive components such as inductors or capacitors to achieve a desired impedance in the antenna loop. The values of the reactive components are also selected to achieve resonance at a desired frequency to increase the amplitude of the signal received by the antenna 30. If the antenna 30 does not include capacitance distributed along the length of the antenna 30 as shown in FIG. 3, the signal conditioning circuit 27 includes capacitance selected such that, in cooperation with the inductance of the antenna, resonance is established in the antenna 30 at the Larmor frequency to improve detection of the NMR signals given off by the region to be imaged. It is further contemplated that the feed board 26 may include other electronic components in addition to the signal conditioning circuit 27, such as a preamplifier circuit or other components to combine signals detected by multiple antennas 30, to perform some initial processing of the signals prior to transmitting the signals to the scanner 12, or to otherwise improve safety or efficacy of the antenna. With reference also to FIG. 10, each antenna 30 includes a first end 31 and a second end 33, where each end is electrically connected to the signal conditioning circuit 27. The antenna 30 includes multiple continuous conductors 40a-40c between the first end 31 and the second end 33 as will be discussed in more detail below.

Figure 11:
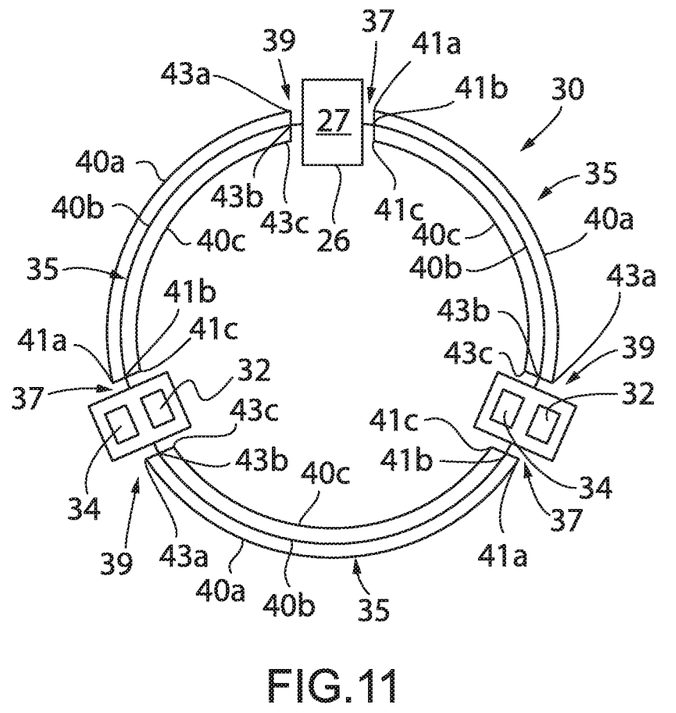
FIG. 11 is a schematic representation of the conductors in one antenna of FIG. 3.

With reference next to FIG. 3, it is further contemplated that each antenna 30 may include capacitance distributed along the length of the antenna. The capacitance may be a single capacitor or multiple capacitors connected in series, in parallel, or a combination thereof. According to the illustrated embodiment, a first capacitor 32 and a second capacitor 34 are mounted to a circuit board and a pair of circuit boards are connected in series with each antenna 30. With reference also to FIG. 11, each antenna 30 includes three antenna segments 35. Each antenna segment 35 includes a first end 37 and a second end 39, where each end is connected either to the signal conditioning circuit 27 on the feed board 26 or to one of the circuit boards on which the capacitors 32, 34 are mounted. Each antenna segment 35 includes multiple continuous conductors 40a-40c between the first end 37 and the second end 39 as will be discussed in more detail below. The value of the capacitors 32, 34 are selected to provide a desired resonant frequency within the overall antenna 30 loop which will result in an improved amplitude of the signal detected by the antenna 30.

As illustrated in FIGS. 10 and 11, each antenna 30 or antenna segment 35 includes multiple electrical conductors connected in parallel and extending for the length of the antenna 30 or antenna segment 35. Turning also to FIGS.

Figure 4:
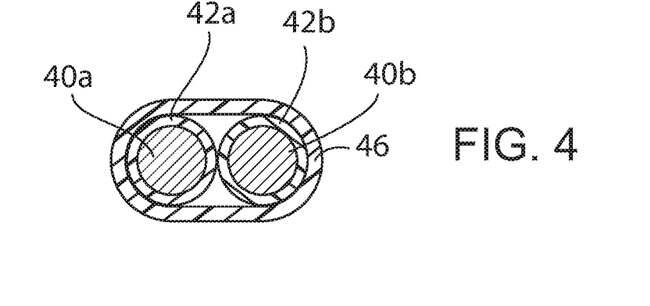
FIG. 4 is a sectional view of a flexible local coil including a pair of electrical conductors positioned in a non-coaxial configuration.
Figure 5:
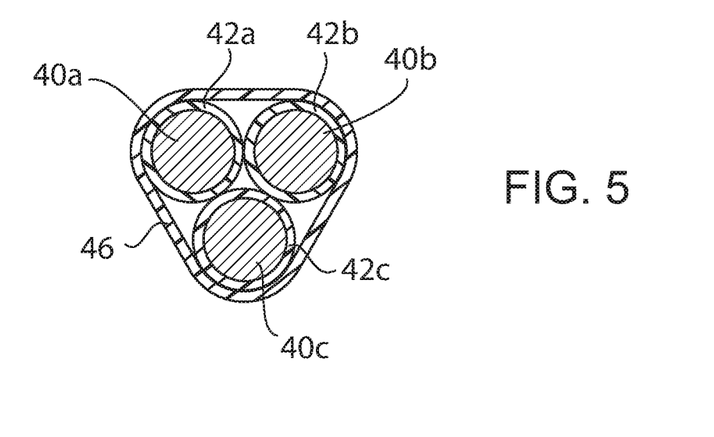
FIG. 5 is a sectional view of a flexible local coil including three electrical conductors positioned in a non-coaxial configuration.

4-7, several embodiments of cables which may be used to implement an antenna 30 or antenna segment 35 are shown. In FIGS. 4 and 5, a first embodiment of a cable for the antenna 30 or antenna segment 35 includes parallel conductors arranged adjacent to each other. The cable includes a first conductor 40a and a second conductor 40b. The first conductor 40a may be copper, aluminum, gold, or other electrically conductive material. The first conductor 40a includes a first insulative jacket 42a extending along the length of the conductor. Similarly, the second conductor 40b may be copper, aluminum, gold, or other electrically conductive material. The second conductor 40b includes a second insulative jacket 42b extending along the length of the conductor. As illustrated, the cable further includes an external jacket 46 surrounding each of the first and second insulative jackets and extending for the length of the antenna 30 or antenna segment 35. Optionally, the external jacket 46 may be replaced, for example, by wire ties spaced apart at intervals that keep the two conductors 40a, 40b extending generally adjacent to each other, such that the first and second conductors bend in tandem with each other and with the flexible substrate 21 to which each antenna is mounted. In FIG. 5, the cable has been expanded from two conductors to three conductors. The cable includes a third conductor 40c which may be copper, aluminum, gold, or other electrically conductive material. The third conductor 40c includes a third insulative jacket 42c extending along the length of the conductor and is similarly contained within the external jacket 46.

Figure 6:
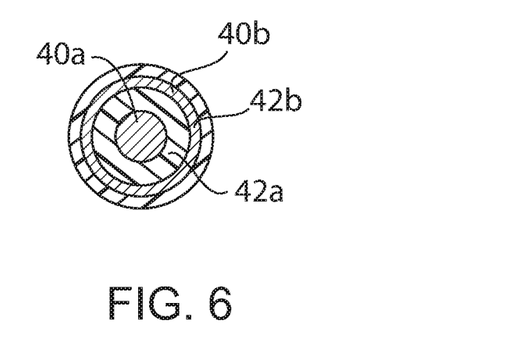
FIG. 6 is a sectional view of a flexible local coil including a pair of electrical conductors positioned in a coaxial configuration.
Figure 7:
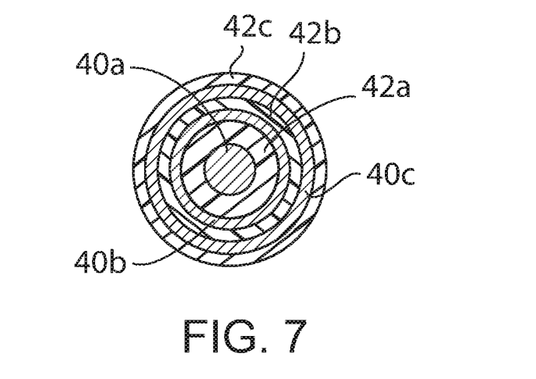
FIG. 7 is a sectional view of a flexible local coil including three electrical conductors positioned in a coaxial configuration.
Figure 8:
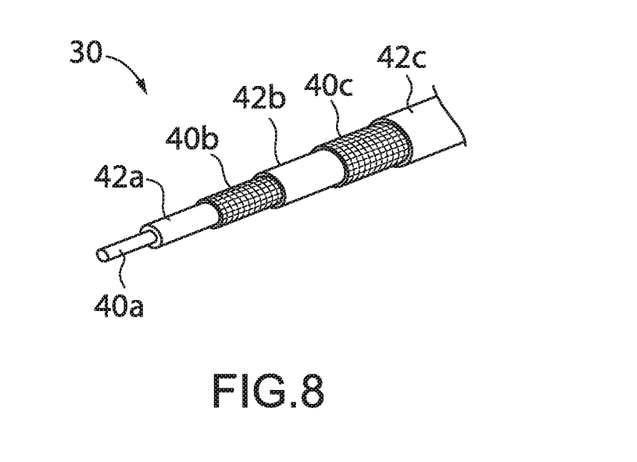
FIG. 8 is a perspective view of one end of a cable for the flexible local coil of FIG. 7 with each layer partially stripped back from a prior layer to show the three electrical conductors positioned in a coaxial configuration.

In FIGS. 6 and 7, a second embodiment of a cable for the antenna 30 or antenna segment 35 includes conductors arranged in a coaxial configuration with respect to each other. The cable includes a first conductor 40a and a second conductor 40b. The first conductor 40a may be copper, aluminum, gold, or other electrically conductive material. The first conductor 40a includes a first insulative jacket 42a extending along the length of the first conductor. Similarly, the second conductor 40b may be copper, aluminum, gold, or other electrically conductive material. The second conductor 40b may be arranged, for example, as a braided sleeve extending around the first insulative jacket 42a and extending for the length of the first conductor 40a. The cable further includes a second insulative jacket 42b surrounding the second conductor 40b. In FIG. 6, a cable which includes only two coaxial conductors is illustrated and the second insulative jacket 42b is also the external jacket for the cable. In FIG. 7, the cable has been expanded from two conductors to three conductors. The cable includes a third conductor 40c which may be copper, aluminum, gold, or other electrically conductive material. The third conductor 40c may be arranged, for example, as a braided sleeve extending around the second insulative jacket 42b and extending along the length of the second conductor 40b. The cable further includes a third insulative jacket 42c surrounding the third conductor 40c. In FIG. 7, the illustrated cable includes three coaxial conductors and the third insulative jacket 42c is the external jacket for the cable. The various layers of the coaxial cable with three conductors is further illustrated in FIG. 8, where each layer is stripped back from the next layer positioned immediately towards the interior of the cable from the prior layer.

Figure 9:
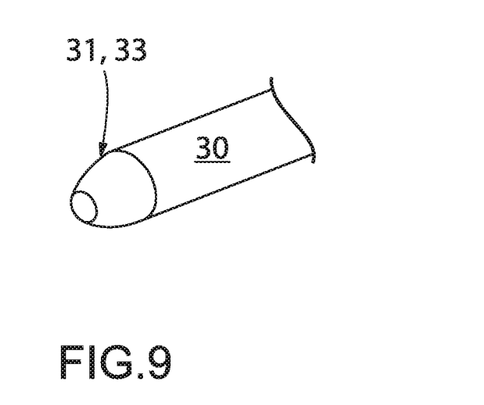
FIG. 9 is a perspective view of one end of the cable for the flexible local coil of FIG. 7 with each layer electrically connected via solder, a cap, or other electrically conductive end cap.

With reference to FIG. 10, each antenna 30 may be configured as a continuous loop, starting and ending at the feed board 26. With reference also to FIG. 11, each antenna 30 may include multiple antenna segments 35 to form a loop with capacitance distributed at intervals along the loop between the ends connected to the feed board 26. Although each conductor 40a, 40b, 40c is illustrated as extending adjacent to the other conductors in the illustrated antenna 30, the illustration is not intended to correspond solely to the cable embodiment shown in FIGS. 4 and 5. Rather, the conductors 40a, 40b, 40c schematically represent the electrical connection between the conductors whether arranged either adjacent to or coaxial with each other. The antenna 30 (as shown in a continuous loop in FIG. 10) or each antenna segment 35 (as shown with distributed capacitance in FIG. 11) includes a first end (31 for each antenna or 37 for each antenna segment) and a second end (33 for each antenna or 39 for each antenna segment). Each of the conductors 40a, 40b, 40c for one antenna 30 or antenna segment 35 is electrically connected to the other conductors both at the first end (31,37) and at the second end (33, 39), establishing a parallel conduction path between the first end (31, 37) and the second end (33, 39) via the conductors 40a, 40b, 40c. In FIG. 9, one end of the antenna 30 or antenna segment 35, arranged in a coaxial configuration, is illustrated as being soldered, such that an electrical connection is established between the first conductor 40a, second conductor 40b, and third conductor 40c. It is further contemplated that this end would also be soldered to a terminal or electrical component either at the feed board 26 or at the circuit board holding the distribution capacitors 32, 34.

In operation, the flexible local coil 20 includes multiple antennas 30 mounted to a flexible substrate 21 to provide improved image quality during an MRI procedure. The magnitude of voltages induced in an antenna as a result of detecting the NMR signals given off during MRI imaging is typically in the order of millivolts (mV). Consequently, it is important that each antenna 30 is configured to provide a maximal SNR. In other words, each antenna 30 should be configured to have as great an amplitude of voltage induced in the antenna as a result of the NMR signal (i.e., the signal) while minimizing an amplitude of voltage induced in the antenna as a result of other factors (i.e., the noise). Because the amplitude of the signal induced from the NMR signal is small, any voltage induced in the antenna as a result of other factors can quickly reduce the SNR and degrade the quality of image obtained by the MRI scanner 12.

The SNR of an antenna 30 in an MRI system is impacted by a number of factors such as ohmic loss. Another factor in determining the SNR is the quality factor, also referred to as the Q-factor, of the antenna 30. The Q-factor for an antenna 30 in an MRI scanner is a measure of the efficiency of the antenna in detecting the NMR signal and is proportional to the inductance of the antenna and is inversely proportional to the resistance of the antenna. When multiple electrical conductors 40a-40c are connected in parallel to form an antenna 30 or antenna segment 35, the overall inductance of the antenna or antenna segment is approximately the same. In contrast, however, when multiple conductors 40a-40c are connected in parallel to form the antenna 30 or antenna segment 35, the resistance of the antenna or antenna segment decreases. The parallel electrical conductors 40a-40c for each antenna 30 or antenna segment 35 create parallel conduction paths along the length of the antenna or antenna segment. Parallel conduction paths reduce resistance between two ends of the conduction path. For example, when two conduction paths, having equal resistance along each path, are connected in parallel, the overall resistance between the two ends of the path will be one-half (½) of the resistance for either path. Similarly, if three conduction paths, having equal resistance along each path, are connected in parallel, the overall resistance between the two ends of the path will be one-third (⅓) of the resistance for either path. For "n" conduction paths connected in parallel, where each path has equal resistance along each path, the overall resistance between the ends of the path is equal to the resistance of a single path divided by the "n" number of conduction paths. Because the parallel electrical conductors 40a-40c decrease the resistance of the antenna 30 or antenna segment 35, the corresponding Q-factor for the antenna increases. This, in turn, increases the SNR of the antenna 30.

It should be understood that the invention is not limited in its application to the details of construction and arrangements of the components set forth herein. The invention is capable of other embodiments and of being practiced or carried out in various ways. Variations and modifications of the foregoing are within the scope of the present invention. It also being understood that the invention disclosed and defined herein extends to all alternative combinations of two or more of the individual features mentioned or evident from the text and/or drawings. All of these different combinations constitute various alternative aspects of the present invention. The embodiments described herein explain the best modes known for practicing the invention and will enable others skilled in the art to utilize the invention.

I claim:

1. A flexible local coil for use with a Magnetic Resonance Imaging (MRI) scanner, the flexible local coil comprising:
    a flexible substrate configured to bend in a plurality of non-parallel axes; and
    a plurality of antennas mounted to the flexible substrate, wherein:
        each of the plurality of antennas includes a plurality of electrical conductors,
        each of the plurality of electrical conductors includes a first end and a second end,
        each of the plurality of electrical conductors for one of the plurality of antennas are mounted together on the flexible substrate and bend along each of the plurality of non-parallel axes in tandem, and
        each of the plurality of electrical conductors for one of the plurality of antennas is electrically connected together at both the first end and the second end and an insulating layer is present between electrical conductors such that a parallel electrical connection is established along a length of the plurality of electrical conductors.

2. The flexible local coil of claim 1 wherein each of the plurality of electrical conductors in one of the plurality of antennas is arranged adjacent to each other.

3. The flexible local coil of claim 1 wherein each of the plurality of electrical conductors in one of the plurality of antennas is arranged in a coaxial configuration.

4. The flexible local coil of claim 1 further comprising a plurality of signal conditioning circuits, wherein:
    each of the plurality of antennas includes a first end and a second end,
    each of the plurality of antennas is connected to one of the signal conditioning circuits at both the first end and the second end, and
    each of the plurality of antennas forms a continuous conductive path between the first end and the second end.

5. The flexible local coil of claim 1 further comprising:
    a plurality of signal conditioning circuits, wherein each of the plurality of signal conditioning circuits corresponds to one of the plurality of antennas; and
    at least one distribution capacitor, wherein:
        each of the plurality of antennas includes at least two antenna segments,
        each antenna segment is connected at a first end to either the corresponding signal conditioning circuit or to the at least one distribution capacitor, and
        each antenna segment is connected at a second end to either the corresponding signal conditioning circuit or to the at least one distribution capacitor.

6. A flexible local coil for use with a Magnetic Resonance Imaging (MRI) scanner, the flexible local coil comprising:
    a flexible substrate configured to bend in a plurality of non-parallel axes; and
    a plurality of channels mounted to the flexible substrate, wherein:
        each of the plurality of channels bends along each of the plurality of non-parallel axes,
        each of the plurality of channels includes a plurality of electrical conductors,
        each of the plurality of electrical conductors includes a first end and a second end, and
        each of the plurality of electrical conductors for one of the plurality of channels is electrically connected together at both the first end and the second end and an insulating layer is present between electrical conductors such that a parallel electrical connection is established along the plurality of electrical conductors from the first end to the second end.

7. The flexible local coil of claim 6 wherein each of the plurality of electrical conductors in one of the plurality of channels is arranged adjacent to each other.

8. The flexible local coil of claim 6 wherein each of the plurality of electrical conductors in one of the plurality of channels is arranged in a coaxial configuration.

9. The flexible local coil of claim 6 further comprising a plurality of signal conditioning circuits, wherein:
    each of the plurality of signal conditioning circuits corresponds to one of the plurality of channels, and
    each of the plurality of electrical conductors for one of the channels is connected to the corresponding signal conditioning circuit at both the first end and the second end.

10. The flexible local coil of claim 6 further comprising:
    a plurality of signal conditioning circuits, wherein each of the plurality of signal conditioning circuits corresponds to one of the plurality of channels; and
    a plurality of distribution capacitors, wherein:
    the plurality of electrical conductors for each of the plurality of channels includes at least two segments,
    each segment is connected at a first end to either the corresponding signal conditioning circuit or to one of the distribution capacitors, and
    each segment is connected at a second end to either the corresponding signal conditioning circuit or to one of the distribution capacitors.

* * * * *